United States Patent
Hu

(10) Patent No.: US 8,148,829 B2
(45) Date of Patent: Apr. 3, 2012

(54) SELF REPAIRING IC PACKAGE DESIGN

(75) Inventor: Guojun Hu, Singapore (SG)

(73) Assignee: STMicroelectronics Pte Ltd., Singapore (SG)

( * ) Notice: Subject to any disclaimer, the term of this patent is extended or adjusted under 35 U.S.C. 154(b) by 127 days.

(21) Appl. No.: 12/650,411

(22) Filed: Dec. 30, 2009

(65) Prior Publication Data

US 2011/0156234 A1    Jun. 30, 2011

(51) Int. Cl.
*H01L 23/29* (2006.01)
(52) U.S. Cl. . 257/788; 257/789; 257/795; 257/E23.116; 257/E23.132; 257/E23.133; 257/E21.502; 438/119; 438/124
(58) Field of Classification Search .......... 257/778, 257/780–785, 629, 632, 787–795, E23.116, 257/E23.132, E23.133, E21.502; 438/119, 438/124
See application file for complete search history.

(56) References Cited

U.S. PATENT DOCUMENTS

| | | | |
|---|---|---|---|
| 7,045,562 B2 | 5/2006 | Thiel | |
| 2004/0007784 A1* | 1/2004 | Skipor et al. | 257/788 |
| 2009/0226828 A1* | 9/2009 | De Jong et al. | 430/58.8 |
| 2010/0264553 A1* | 10/2010 | Wainerdi et al. | 257/783 |

OTHER PUBLICATIONS

White, S.R., et al., "Autonomic healing of polymer composites", Nature, vol. 409, 2001, pp. 794-797.
Kessler, M.R., et al., "Self-healing structural composite materials", Composites Part A: Applied Science and Manufacturing, vol. 34(8), 2003, pp. 743-753.
White, S.R., et al., "Autonomic Healing of Polymers", MRS Bulletin, vol. 33, pp. 766-769, 2008.

\* cited by examiner

*Primary Examiner* — Jasmine Clark
(74) *Attorney, Agent, or Firm* — Seed IP Law Group PLLC

(57) ABSTRACT

An integrated circuit package comprises a molding compound covering a semiconductor die. A healing substance is on the surface of the semiconductor die at an interface of the molding compound and the semiconductor die. The healing compound comprises a catalyst and a plurality of microcapsules containing a sealing compound. If the molding compound becomes delaminated from the semiconductor die the microcapsules rupture and spill the sealing compound. When the sealing compound is spilled and contacts the catalyst the sealing compound and catalyst polymerize and fasten the molding compound to the semiconductor die.

20 Claims, 10 Drawing Sheets

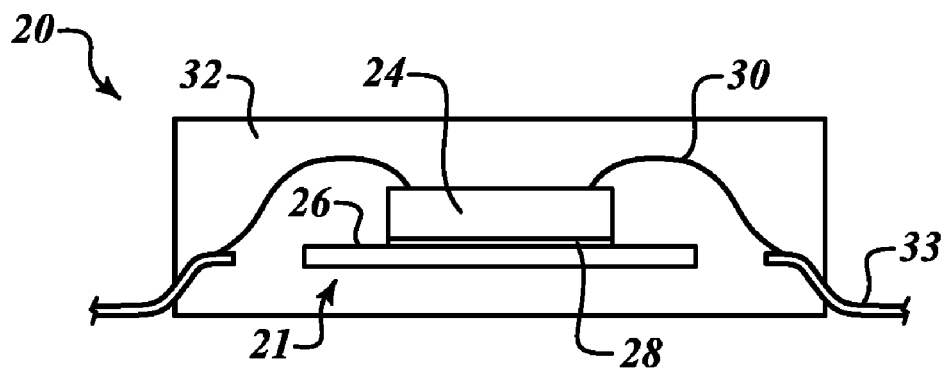
FIG. 1A *(PRIOR ART)*
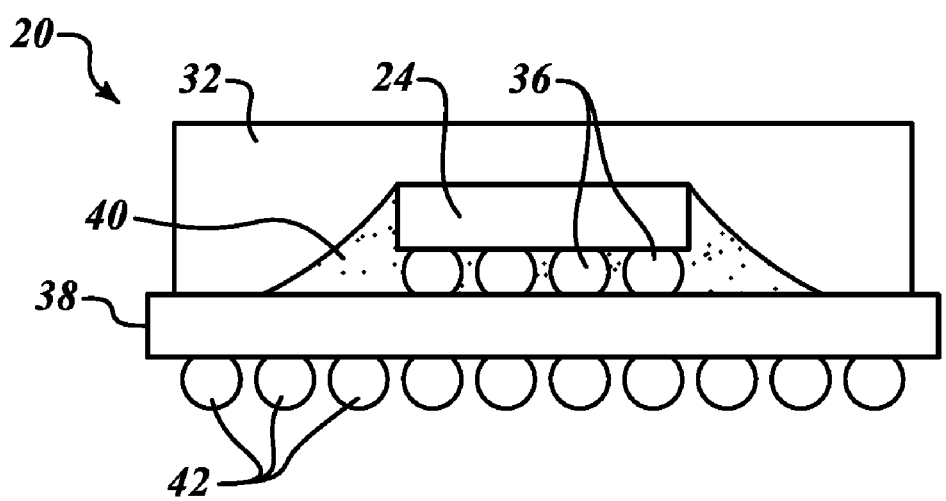
FIG. 1B *(PRIOR ART)*

SELF REPAIRING IC PACKAGE DESIGN

BACKGROUND

1. Technical Field

The present application relates to the packaging of a semiconductor die and more particularly to the repairing of delaminations within the package.

2. Description of the Related Art

Integrated circuits are formed on wafers of semiconductor material. On a typical semiconductor wafer, many identical integrated circuits are formed. The wafer is then diced, namely, cut into many dice, each die comprising an integrated circuit.

The die is usually then packaged to protect it from physical damage and to place it in a form which can be easily installed in a system of which it will be a part. FIG. 1A illustrates a side view of a typical packaged integrated circuit. The package 20 comprises a lead frame 21 and a semiconductor die 24 bonded to a die pad 26 of the lead frame 21 by an adhesive layer 28. Wires 30 are coupled between the die 24 and leads 33 by a wire bonding process. Molding compound 32 covers the die 24 and protects it from outside elements. A heat sink may also be provided in the package 20.

FIG. 1B illustrates another typical semiconductor package 20, the flip chip ball grid array. Solder bumps 36 are attached to contact pads (not shown) of die 24. The die 24 is mounted on substrate 38 with the solder bumps 36 in electrical contact with pads (not shown) of the substrate 38. An epoxy underfill 40 fills the gaps between the solder bumps 36, the die 24, and the substrate 38. Molding compound 32 covers the die 24, and the underfill 40. Solder balls 42 are attached to the surface of the substrate 38 opposite the solder bumps 36.

For both types of packages, while the packaging protects the die 24 from many kinds of damage, the packaging subjects the die 24 to other risks. The package 20 goes through many cycles of heating and cooling throughout its lifetime. The molding compound 32 typically must be in a liquid state when it is first applied and thus it must be at a temperature above its melting point. The liquid molding compound 32 covers the die 24 and the lead frame 21 or substrate 38 heating both the die 24 and the lead frame 21 or substrate 38. The molding compound 32 then is cooled and becomes a solid bonded to both the die 24 and the lead frame 21 or substrate 38, thereby encapsulating the integrated circuit into a final semiconductor product. At this point the semiconductor product may be subject to testing during which the package 20 heats up, then cools, after which it is further tested to ensure that the integrated circuit is functional and that the package 20 is intact. Thus before the integrated circuit is ever sold it is usually subjected to one or more heating/cooling cycles. In some testing, the semiconductor products are subjected to a burn-in cycle in which the packages are heated and cooled from external sources for many cycles, during which time they are tested for operation.

When the die 24 is in its operating environment, it is again subjected to many cycles of heating and cooling. Each time the integrated circuit is turned on and in use the die 24 may become very hot. The heating of the die 24 causes the lead frame 21/substrate 38 and the molding compound 32 to become hot as well. When the integrated circuit turns off, the die 24, the substrate 38, and the molding compound 32 cool once again. The package 20 may also become hot or cool based on the physical environment in which it is placed.

When the die 24 is heated or cooled, it expands or shrinks according to a coefficient of thermal expansion (CTE) particular to the material of the die 24. Each component of the integrated circuit package 20 typically has a different CTE. A material with a high CTE will expand or shrink more than a material with a lower CTE under a given increase or decrease in temperature. When the package 20 is heated or cooled, the molding compound 32, the die 24, and the lead frame 21 or substrate 38 expand or contract differently from each other. This disparity in expansion causes the die 24 to experience compressive, expansive, and tensile forces. The stress is greater at the edges and corners of the die 24. It is important that the integrity of the package be maintained to prevent the integrated circuit from failing.

BRIEF SUMMARY

According to one embodiment, a delamination repair substance is positioned on the semiconductor die between the die and the molding compound. The molding compound may crack or become delaminated from the semiconductor die during expansion and compression of the molding compound, the semiconductor die, and the substrate as a result of operating the die. A crack will perturb the delamination repair substance. The perturbation of the delamination repair substance activates a mechanism that causes the delamination repair substance to fix the crack and strongly adhere the molding compound to the semiconductor die.

In one embodiment the delamination repair substance comprises microcapsules adjacent a catalyst. The microcapsules contain a liquid sealing agent or sealing compound. When the microcapsules break, the liquid sealing agent comes out and mixes with the catalyst. When the sealing agent mixes with the catalyst, the sealing agent polymerizes and bonds to the molding compound and the die.

In one embodiment the microcapsules are configured to rupture and spill the sealing liquid when perturbed by a delamination of the molding compound from the semiconductor die.

In one embodiment, the sealing compound is dicyclopentadiene and the catalyst is a Grubbs catalyst.

In one embodiment the delamination repair substance is positioned between the substrate and the molding compound. The delamination repair substance is configured to repair a delamination of the molding compound from the substrate.

One embodiment is a method for forming an integrated circuit package with a delamination repair substance. A semiconductor die is attached to a surface of a substrate. A delamination repair substance is applied to a surface of the semiconductor die. It may also be applied to the substrate. The die is then covered in a molding compound, the delamination repair substance being between the molding compound and the semiconductor die.

In one embodiment the delamination repair substance is applied to the surface of the semiconductor die by dipping the semiconductor die into the delamination repair substance. In one embodiment the delamination repair substance is sprayed onto the surface of the semiconductor die.

BRIEF DESCRIPTION OF THE SEVERAL VIEWS OF THE DRAWINGS

FIG. 1A shows a schematic side view of a known integrated circuit package.

FIG. 1B shows a schematic side view of another known integrated circuit package.

DETAILED DESCRIPTION

Figure 2A:
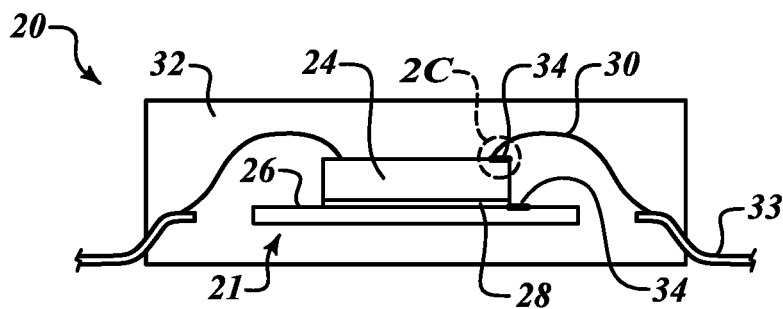
FIGS. 2A-2C show schematics of failure mechanisms analyzed according to the present invention.
Figure 2B:
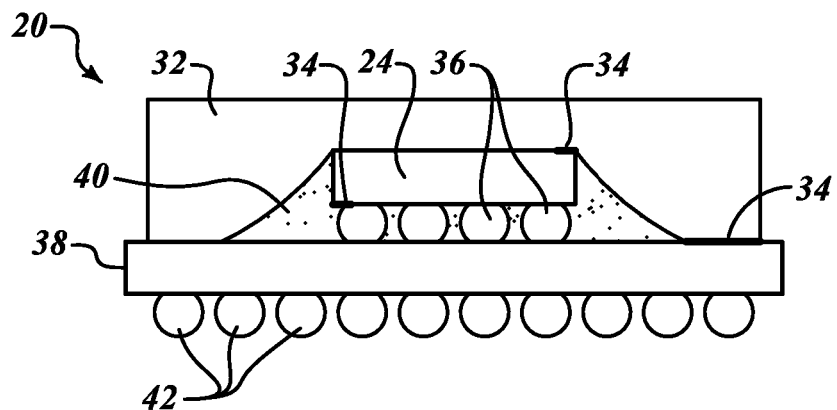
Figure 2C:
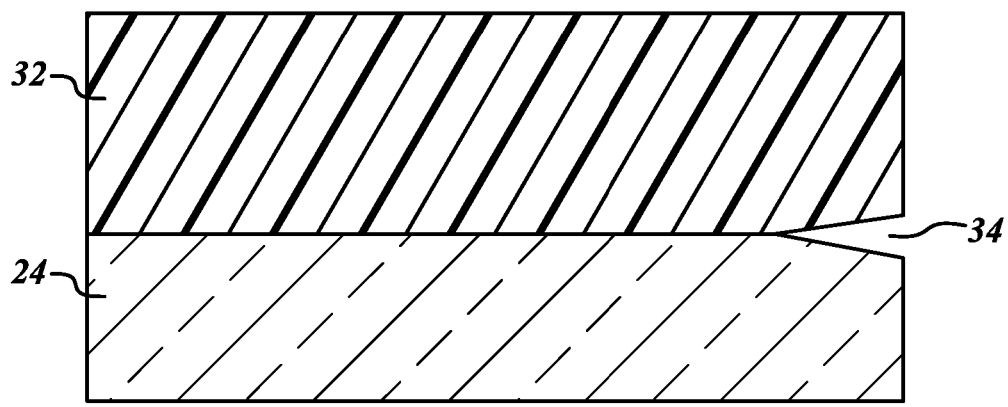

FIGS. 2A-2C illustrate potential cracked propagation locations that have been identified according to various embodiments of the present invention. As shown in FIG. 2A, a package 20 includes a die 24 mounted on a lead frame 21. The die 24 is coupled to the pad 26 by an adhesive layer 28. In some embodiments, the die 24 sits on the lead frame 26 without such an adhesive layer. Wires 30 extend from leads 33 of the lead frame 21 to electrically connect the integrated circuit die to the leads. A molding compound 32 encapsulates the entire semiconductor die 24 as well as the wires 30 and portions of the lead frame 21. As the package 20 undergoes various heating and cooling cycles, both during testing and in use, one or more cracks 34 may develop at various locations in the molding compound that makes up the encapsulation layer 32, adjacent the die 24 or adjacent the lead frame 21. FIG. 2B illustrates similar cracks 34 which may arise in a different type of package, one in which the die 24 is coupled through solder bumps 36 to a substrate 38 in the form of a flip chip ball grid array, land grid array, or other well-known solder technique for a package 20. In packages of the type shown in FIG. 2B, an epoxy underfill 40 may surround the edges of the die 24 and the molding compound 32 encloses both the die 24 and the epoxy underfill 40. Even in packages of this type, the inventor has realized that various cracks 34 may arise in different locations which may cause failure in operation of the integrated circuit on the die 24.

The repeated stresses may cause a delamination of the molding compound 32 from the die 24 or from other components of the package 20. Delamination is the separation or unbonding of any of the components of the IC package 20. For example, under stress, the adhesion between the various components in the package 20 may fail. Delamination between any of the components can damage functionality of the integrated circuit.

FIG. 2C illustrates an enlarged view of the crack 34 between the molding compound 32 and the die 24 illustrated in FIG. 1A. The crack 34 represents the beginning of a delamination of the molding compound 32 from the die 24. Due to stresses introduced during any of the stages of manufacture or use of the integrated circuit, the molding compound 32 may begin to become detached or unbounded from the surface of the die 24. If left unchecked, the delamination spreads until a large portion of the molding compound 32 becomes delaminated from the semiconductor die 24. Delamination of the die 24 from the molding compound 32 may cause failure of the integrated circuit. Moisture may enter into the space between the molding compound 32 and the die 24. The presence of moisture on the die 24 may cause short circuiting between two or more of the contact pads (not shown) of the die 24. If one or more of the bonding wires 30 is damaged, the integrated circuit may begin to function poorly or may cease functioning altogether. A delamination poses these and other dangers to the functionality of the integrated circuit.

Figure 2D:
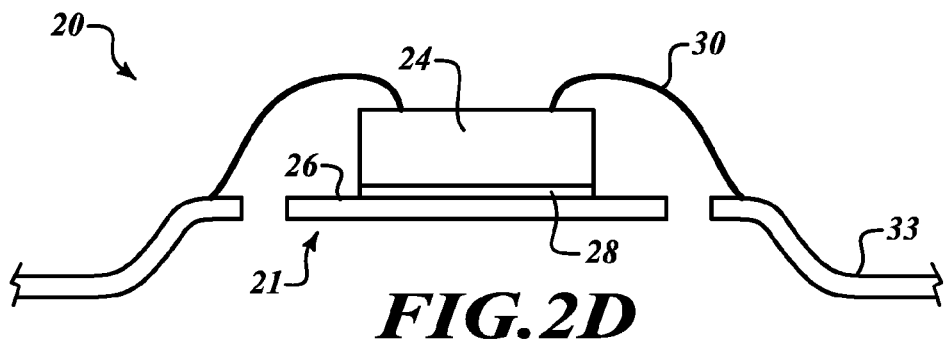
FIGS. 2D-2G show schematic side views of an integrated circuit package at various stages of manufacture according to one embodiment of the present invention.

FIG. 2D illustrates an integrated circuit package 20 in an intermediate stage of manufacture according to one embodiment. Semiconductor die 24 is attached to a top surface 26 of a lead frame 21 by means of an adhesive film 28 as previously described. Wires 30 are formed between the semiconductor die 24 and leads 33 of the lead frame 21 by a wire bonding process.

Figure 2E:
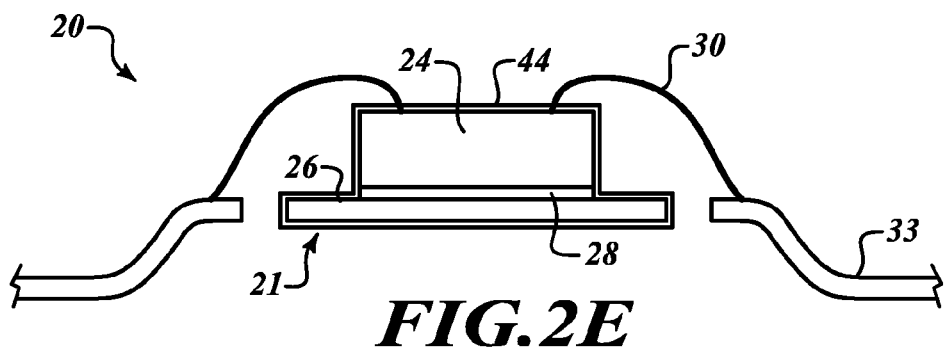

In FIG. 2E a delamination repair substance 44 is applied to the surfaces of the semiconductor die 24 and the die pad 26. The delamination repair substance 44 may be in liquid form when applied. The delamination repair substance 44 may be applied by any suitable means such as by being sprayed onto the die 24 and die pad 26. In one embodiment the delamination repair substance 44 is applied by dipping the die 24 and die pad 26 into the delamination repair substance 44 to coat the die 24 and die pad 26 in the delamination repair substance 44. In one embodiment, the entire lead frame, including the leads 33, is coated with the repair substance, but this is not required in all embodiments.

Figure 2F:
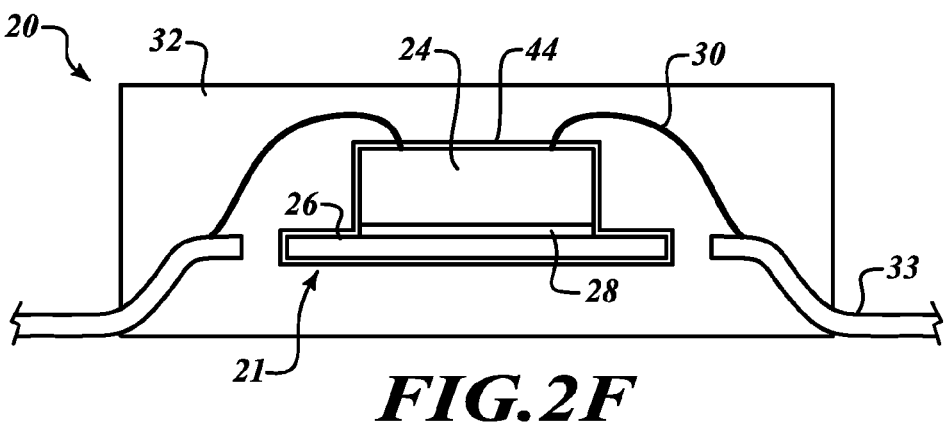

In FIG. 2F a molding compound 32 is applied to cover the die 24, the wires 30, and the die pad 26 of the lead frame 21 with the leads 33 protruding from the molding compound 32. The molding compound 32 serves to protect the die 24, the die pad 26, and the bonding wires 30 from mechanical damage as well as other forms of damage. The molding compound 32 is bonded to the surface of the die 24 and forms a seal which protects the die 24 from moisture and other contaminants that may harm functionality of the integrated circuit. The delamination repair substance 44 is on the surface of the die 24 at the interface of the semiconductor die 24 and the molding compound 32. The delamination repair substance 44 is also on the surface of the die pad 26 between the molding compound 32 and the die pad 26.

Figure 2G:
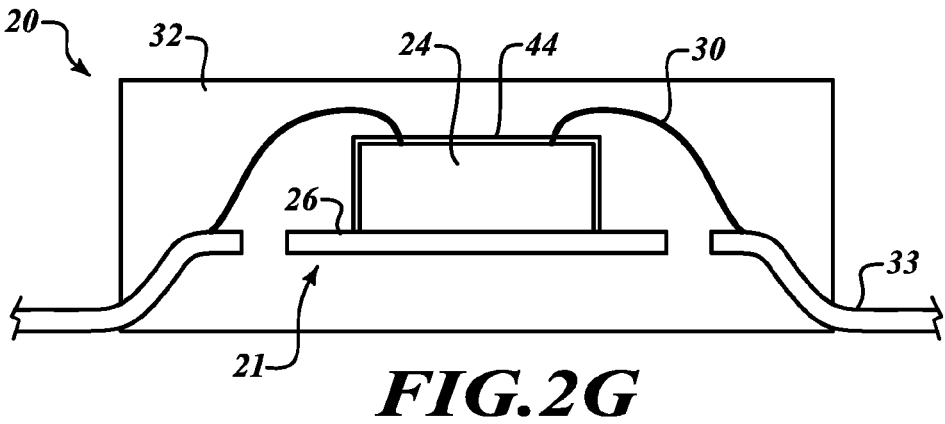

FIG. 2G is an embodiment wherein the delamination repair substance 44 is applied only to the semiconductor die 24, and a layer 28 is not present. The delamination repair substance 44 may be applied to as many or as few surfaces of the semiconductor die 24 as desired.

Figure 3A:
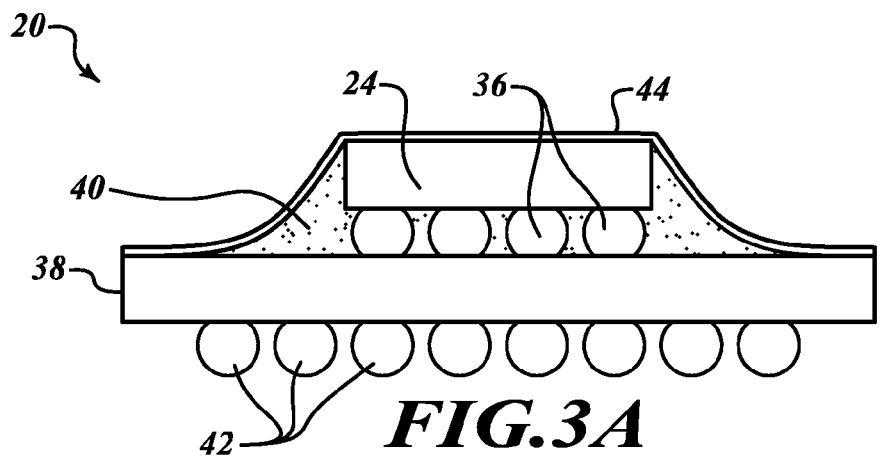
FIGS. 3A-3C show schematic side views of another type of integrated circuit package at various stages of manufacture according to another embodiment of the present invention.
Figure 3B:
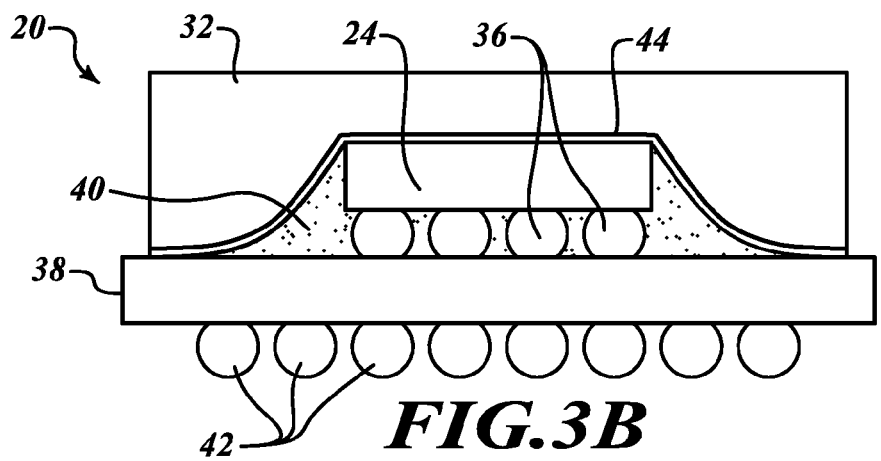
Figure 3C:
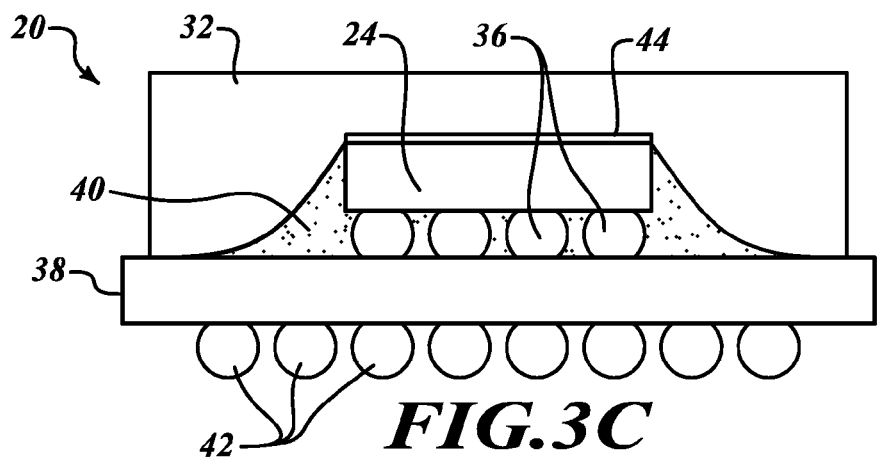

FIG. 3A illustrates a flip chip ball grid array integrated circuit package 20 in an intermediate stage of manufacture. Solder bumps 36 are attached to the semiconductor die 24. Solder balls are attached to the substrate 38. The semiconductor die 24 is coupled to the substrate 38 with the solder bumps 36 in contact with the substrate 38. The solder bumps 36 electrically connect the integrated circuitry (not shown) of the semiconductor die 24 to circuitry (not shown) in the substrate 38. The circuitry in the substrate 38 is connected to the solder balls 42. Underfill 40 fills the gaps between the semiconductor die 24 and the substrate 38. A delamination repair substance 44 is on the semiconductor die 24 and the underfill 40. In FIG. 3B the molding compound 32 covers the semiconductor die 24, the underfill 40, and part of the substrate 38. In the embodiment illustrated in FIG. 3C, the delamination repair substance 44 covers only the semiconductor die 24. In one embodiment, the delamination repair substance 44 is also applied to the die 24 before the underfill 40 is applied, so that it is also between the die 24 and the underfill 40. It may also be applied to the substrate 38 to be between the substrate 38 and the underfill 40.

The function of the delamination repair substance 44 is to repair a delamination of the molding compound 32 from the semiconductor die 24. A delamination of the molding compound 32 from the substrate 38 perturbs the delamination repair substance 44 causing the delamination repair substance 44 to respond by refixing the molding compound 32 in place relative to the semiconductor die 24 at the location of the delamination. In one embodiment, the response of the delamination repair substance 44 to the perturbation is a chemical reaction which causes the delamination repair substance 44 to harden and bond to the molding compound 32 and the semiconductor die 24. In other embodiments the perturbation may mechanically damage some component of the delamination repair substance 44 releasing an agent which will cause the delamination repair substance 44 to fix the molding compound 32 to the semiconductor die 24. The delamination repair substance 44 may be configured to repair the delamination by any suitable means.

In the embodiment illustrated in FIG. 2F, the delamination repair substance 44 is also configured to repair a delamination of the molding compound 32 from the die pad 26 of the lead frame 21. In this embodiment a delamination of the molding compound 32 from the die pad 26 perturbs the delamination repair substance 44. The delamination repair substance 44 responds by fixing the molding compound 32 to the die pad 26 at the location of the delamination.

Delaminations of the molding compound 32 from the die 24 or from the die pad 26 are not intended to happen. They are an occasional and unintended consequence of the thermal and mechanical stresses placed on the integrated circuit package 20 during repeated cycles of heating and cooling as described above. When the die 24 is heated or cooled, it expands or shrinks according to a coefficient of thermal expansion (CTE) particular to the material of the die 24. A material with a high CTE will expand or shrink more than a material with a lower CTE under a given increase or decrease in temperature. When the package 20 is heated or cooled, the molding compound 32, the die 24, and the die pad 26 expand or contract differently from each other. This disparity in expansion causes the die 24 to experience compressive, expansive, and tensile forces. The stress is greater at the edges and corners of the die 24. The repeated cycles of expansion and contraction may eventually cause delamination of the molding compound 32 from other components of the package 20. Delamination is the separation or unbonding of any components of the die 24. Delamination between any of the components can damage functionality of the integrated circuit.

The delamination repair substance 44 is applied to the die 24 or die pad 26 against the chance that the molding compound 32 becomes delaminated from the die 24 or die pad 26 during any phase of the integrated circuit package's lifetime. The delamination repair substance 44 repairs the delamination and thus may extend the lifetime of the integrated circuit.

The integrated circuit packages 20 illustrated in FIGS. 2A-2G and 3A-3C are not drawn to scale. The components thereof may be larger or smaller relative to one another than what is shown. For example, the thickness of the delamination repair substance 44 relative to the molding compound 32, the die pad 26, and the die 24 may be much smaller than shown. Also, the there may be additional components of the integrated circuit package 20 not shown for simplicity sake.

In the embodiment illustrated in FIG. 3B, the delamination repair substance 44 is also configured to repair a delamination of the molding compound 32 from the underfill 40. In this embodiment a delamination of the molding compound 32 from the underfill 40 perturbs the delamination repair substance 44. The delamination repair substance 44 responds by fixing the molding compound 32 to the underfill 40.

The delamination repair substance 44 is applied to the die 24 or underfill 40 against the chance that the molding compound 32 becomes delaminated from the die 24 or underfill 40 during any phase of integrated circuit packages lifetime. The delamination repair substance 44 repairs the delamination and thus may extend the lifetime of the integrated circuit.

Figure 4:
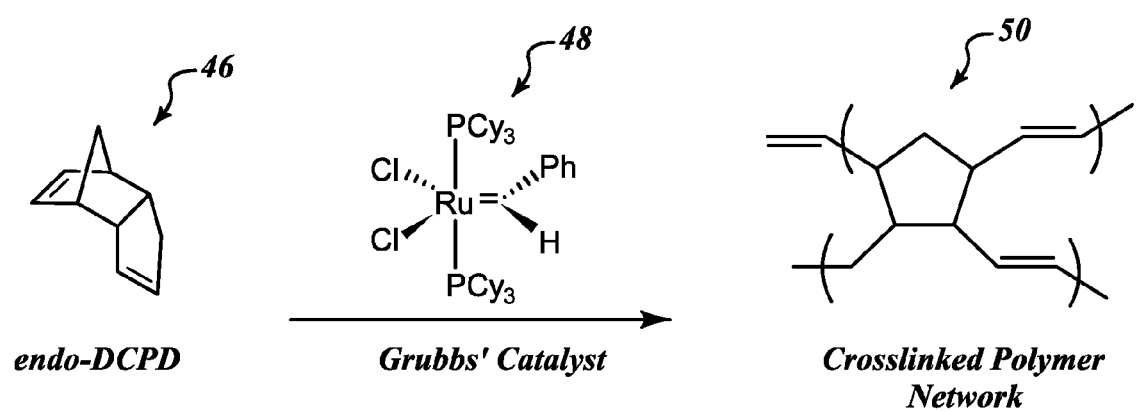
FIG. 4 illustrates compounds that form part of a delamination repair substance according to one embodiment of the present invention.

FIG. 4 illustrates possible chemical components of the delamination repair substance 44 according to one embodiment. In this embodiment, the delamination repair substance 44 contains a dicyclopentadiene (DCPD) 46. The DCPD 46 is a sealing agent or sealing compound in liquid form. The delamination repair substance 44 also includes a Grubbs Catalyst 48 that is adjacent the DCPD but not yet mixed with it. When the DCPD 46 contacts the Grubbs Catalyst 48, the DCPD 46 polymerizes and hardens into a solid material 50 as described in "Autonomic Healing of Polymer Composites", Nature, Vol. 409, 2001, pp 794-797, which is incorporated herein by reference.

Figure 5A:
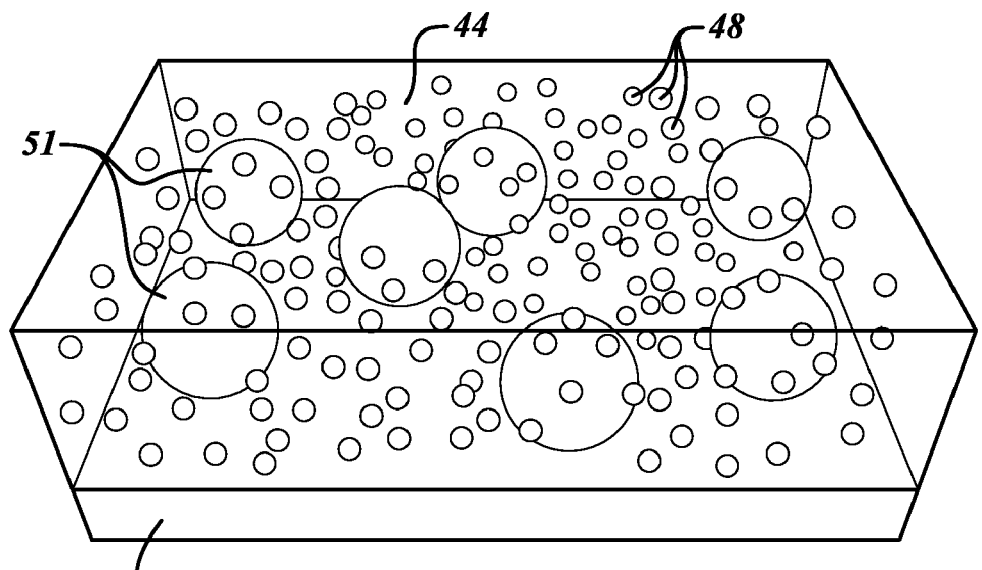
FIGS. 5A-5D an elevated top view of a delamination repair substance on a substrate and various stages of the repair substance repairing a crack.
Figure 5B:
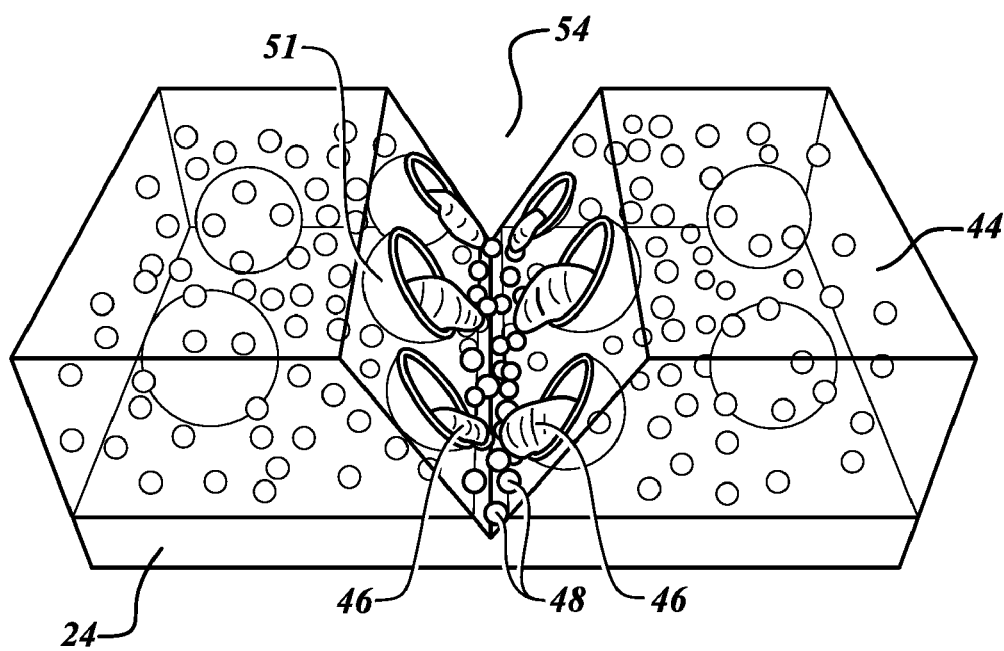

FIGS. 5A-5D illustrates the functionality of a specific embodiment of the delamination repair substance 44. In FIG. 5A, the delamination repair substance 44 is made up of Grubbs Catalyst 48 and microcapsules 51 filled with DCPD sealing agent 46. The Grubbs Catalyst 48 and microcapsules 51 are shown on the die 24. In FIG. 5B, a crack 34 has propagated through the delamination repair substance 44 rupturing the microcapsules 51. The microcapsules 51 are hollow spheres containing sealing liquid or sealing agent DCPD 46. In one embodiment the microcapsules 51 are formed of a urea-formaldehyde shell. The microcapsules 51 may measure as many as hundreds of micrometers in diameter or as small as a few microns in diameter. The thickness of the shell of the microcapsule may be for example 1 μm or less. The thickness of the shell will depend on the material used for the microcapsule and may be larger or smaller than described above as long as the microcapsule will rupture when perturbed by a delamination. Any other suitable material and dimensions may be used for the microcapsules 51.

Figure 5C:
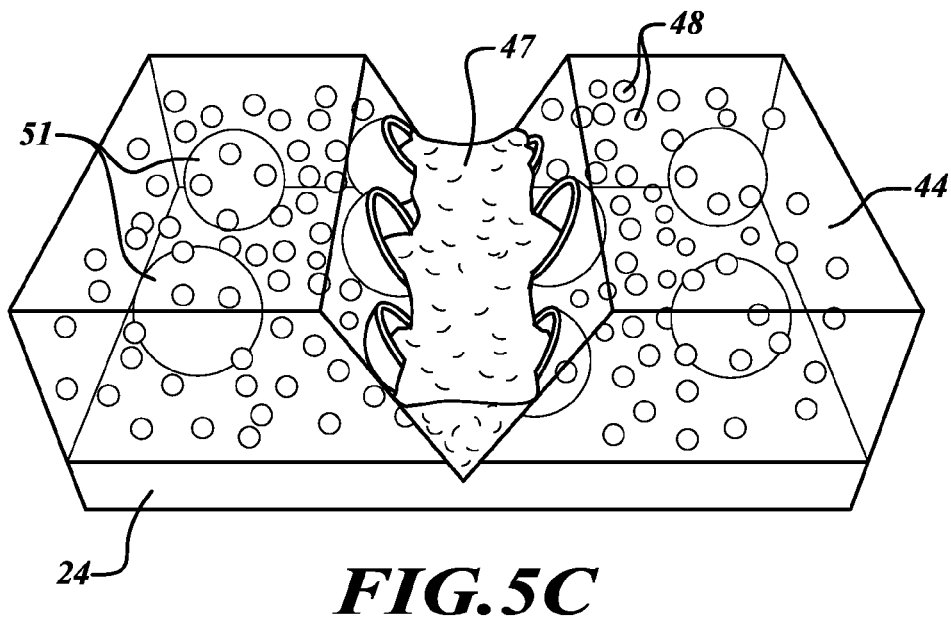
Figure 5D:
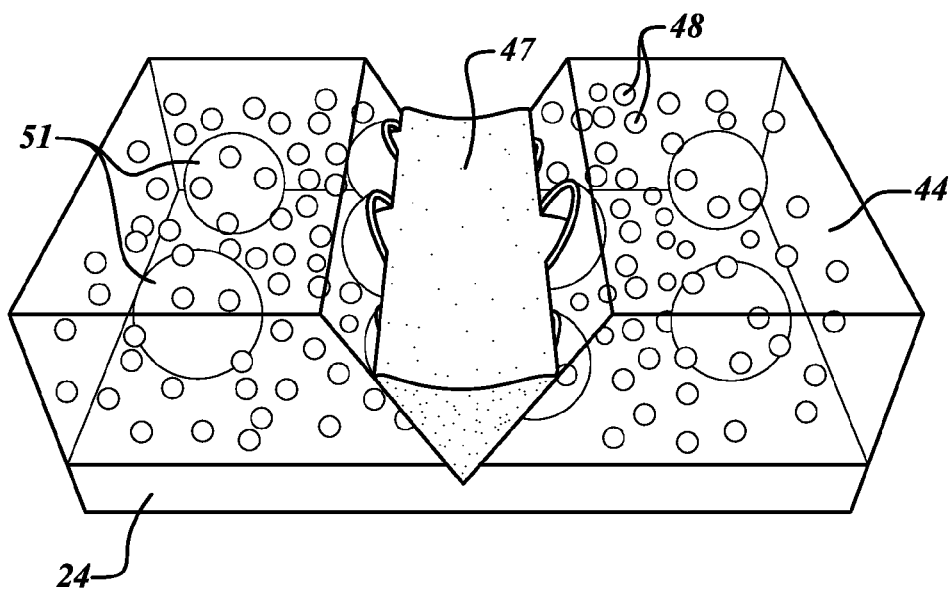

When the crack 54 perturbs the microcapsules 51, the microcapsules 51 rupture and spill the liquid sealing agent 46. In FIG. 5C the liquid sealing agent 46 mixes with the Grubbs Catalyst 48 to form a repair agent 47. The sealing agent 46 and Grubbs Catalyst 48 polymerize and harden to form a repair agent 47 as described in relation to FIG. 4. In FIG. 5D, the released portions of the delamination repair substance 44 have fully polymerized and hardened to be part of molding compound 32 and form a solid, continuous seal of the repair agent 47 along the die 24 and molding compound 32. It may take a few minutes for the sealing agent 46 to fully polymerize after exposure to the Grubbs Catalyst 48.

Figure 6A:
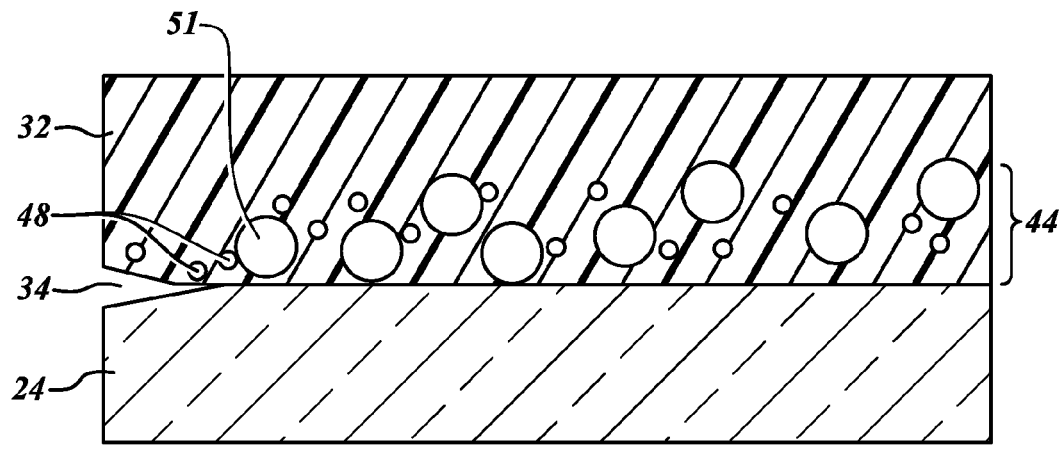
FIGS. 6A-6B shows a cross-section of a delamination developing between a molding compound and a semiconductor die and the repairing of the delamination according to principles of the present invention.

FIG. 6A shows an enlarged view of the surface of a semiconductor die 24 covered by a molding compound 32. The delamination repair substance 44, embodied by the microcapsules 51 and Grubbs Catalyst 48, is on the surface of the die 24 or at the interface between the die 24 and the molding compound 32. A crack 34 has begun to propagate between the molding compound 32 and the die 24. The crack 34 represents a delamination of the molding compound 32 from the die 24. The crack 34 may be the result of thermal and mechanical stresses on the integrated circuit package 20 as described above.

Figure 6B:
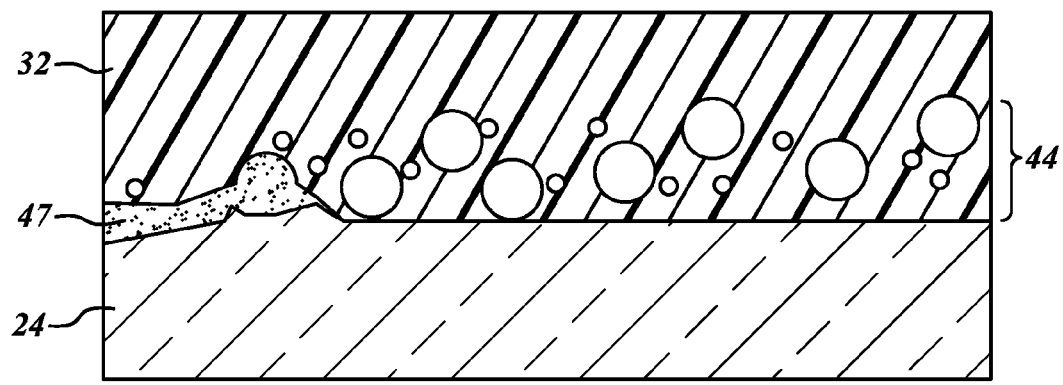

In FIG. 6B the crack 34 has perturbed one or more microcapsules 51 and the perturbed microcapsules 51 have ruptured and spilled the liquid sealing agent 46. The liquid sealing agent 46 has mixed with the Grubbs Catalyst 48 and polymerized and hardened to a repair agent 47. The polymerization of the delamination repair substance 44 has prevented further propagation of the delamination as well as fixed the molding compound 32 to the semiconductor die 24. The damage-induced triggering mechanism provides site-specific autonomic control of repair. The polymerization of the delamination repair substance 44 bonds or seals the delamination repair substance 44 to the molding compound 32 and to the die 24 at the location of the delamination. In one embodiment the catalyst 48 and microcapsules 51 mix with the molding compound 32 at the interface of the molding compound 32 and the semiconductor die 24. This is possible because the molding compound 32 is applied to the semiconductor die 24 in liquid form. The delamination repair substance is also in liquid or semi-liquid form. This allows the catalyst and the microcapsules to mix near the surface of the semiconductor die 24. This allows the molding compound 32 to bond to the surface of the semiconductor die 24 when it is first applied while allowing the catalyst 48 and microcapsules 51 to be at the surface of the die 24 as well.

The catalyst 48 and microcapsules 51 may be applied to the semiconductor die 24 as a semi-liquid paste. They may also be applied as part of a carrier liquid. The catalyst 48 and microcapsules 51 may be applied at a variety of temperatures ranging from cooler than room temperature to hundreds of degrees Celsius. The reaction between the sealing agent 46 and the catalyst 48 will work at a wide range of temperatures. Delamination may occur at both cold and hot temperatures, thus it is advantageous that the polymerization reaction be able to occur throughout the full range of temperatures that the integrated circuit package 20 is likely to endure.

Figure 7:
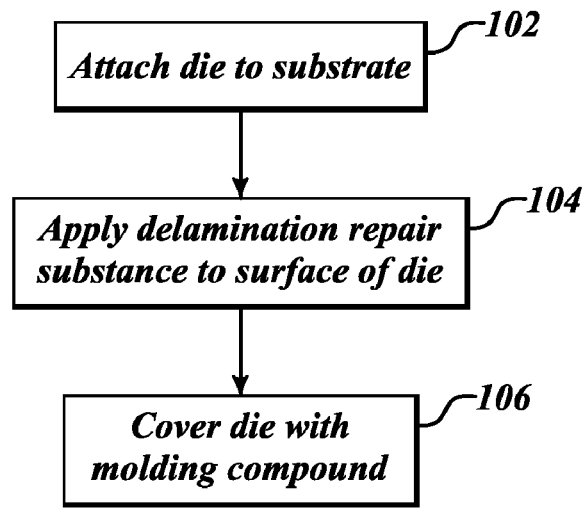
FIG. 7 shows a process for manufacturing an integrated circuit according to one embodiment of the present invention.

FIG. 7 illustrates steps of a process for manufacturing an integrated circuit according to one embodiment. At 102, a semiconductor die 24 is attached to a substrate. The substrate may be a die pad 26 of a lead frame 21 or any other suitable substrate. At 104 a delamination repair substance 44 is applied to the semiconductor die 24. The delamination repair substance 44 covers one or more surfaces of the die 24. The delamination repair substance 44 may be applied by any suitable means such as spraying on the surface of the die 24, brushing on the surface of the die 24, or dipping the die 24 into the delamination repair substance 44. At 106 the die 24 is covered with a molding compound 32. The molding compound 32 may be an epoxy molding compound 32 or any other appropriate molding compound 32. The molding compound 32 may be applied by any of a number of known methods or any other appropriate method.

Figure 8:
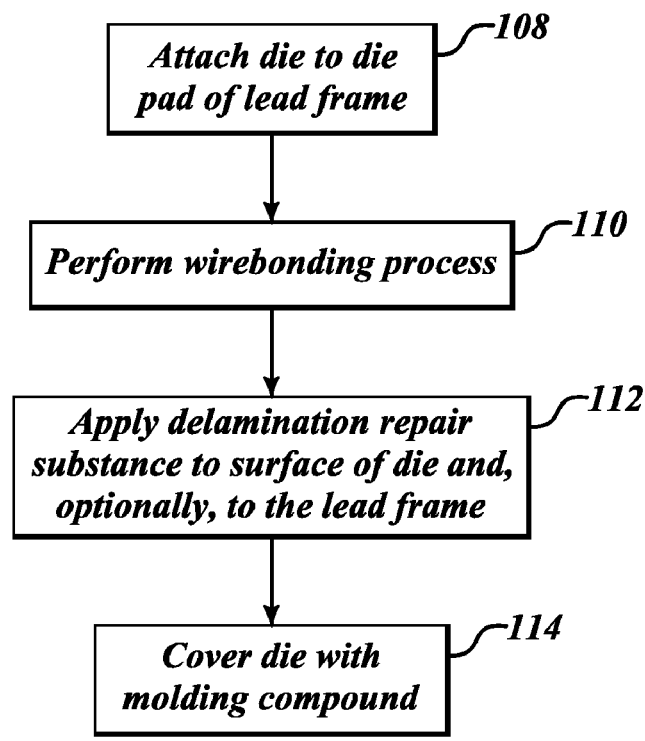
FIG. 8 shows another process for manufacturing an integrated circuit according to one embodiment of the present invention.

FIG. 8 illustrates steps of a process for manufacturing an integrated circuit according to one embodiment. At 108 a semiconductor die 24 is attached to the die pad 26 of a lead frame 21. At 110 wirebonding is performed to form wires 30 between the die 24 and leads 33 of the lead frame 21. At 112, a delamination repair substance 44 is applied to the surface of the die 24 as described in relation to FIG. 7. At 114 a molding compound 32 is applied as described in relation to FIG. 8.

Figure 9:
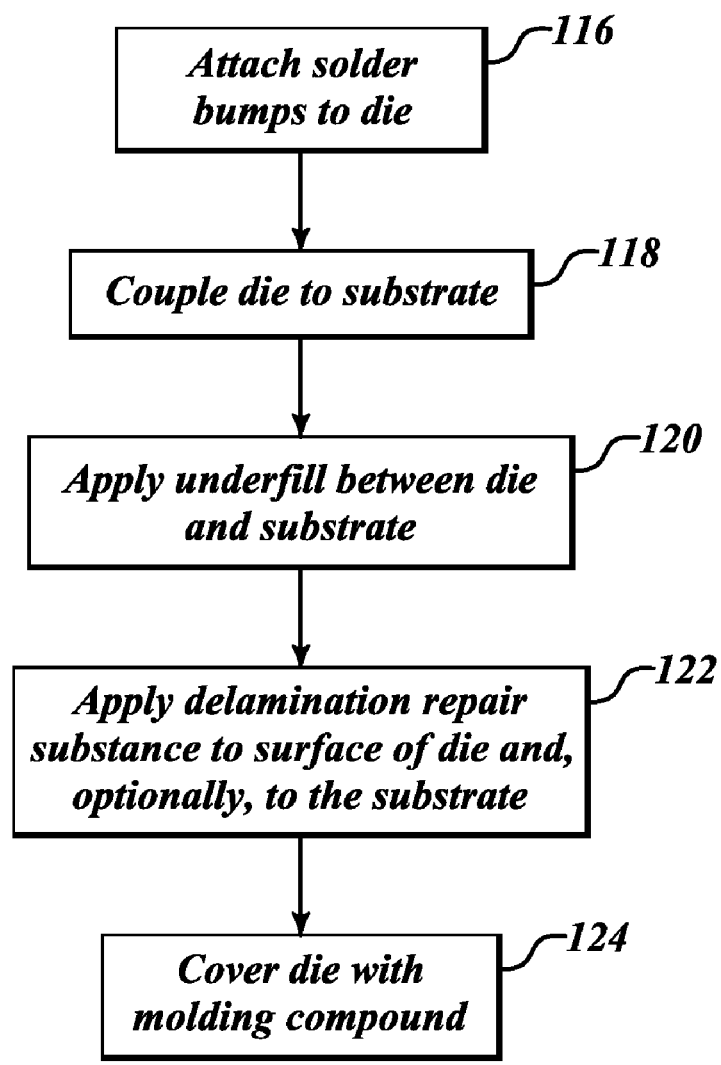
FIG. 9 shows a process for manufacturing an integrated circuit according to one embodiment of the present invention.

FIG. 9 illustrates steps of a process for manufacturing an integrated circuit according to one embodiment. At 116 solder bumps 36 are attached to a semiconductor die 24. At 118 the die 24 is coupled to a substrate 38 such that the solder bumps 36 contact both the die 24 and the substrate 38. At 120 an epoxy underfill 40 is applied in the gaps between the die 24 and the substrate 38. At 122 a delamination repair substance 44 is applied to the surface of the semiconductor die 24 as described in relation to FIGS. 7 and 8. At 124 the die 24 is covered with a molding compound 32. The various steps 104, 112, and 122 of applying the delamination repair occur earlier in the process, for example, before the dies is coupled to the substrate, or before the underfill is applied in alternative embodiments.

In relation to FIGS. 7-9, after the molding compound 32 has been applied, a crack 34 or delamination may develop between the die 24 and the molding compound 32 due to thermal and mechanical stresses. If the delamination perturbs the delamination repair substance 44, then the delamination repair substance 44 may begin a repair process in which the delamination repair substance 44 hardens and seals the molding compound 32 to the semiconductor die 24 at the site of the delamination. In this way, the integrated circuit package 20 self-repairs. This may advantageously prolong the life of the integrated circuit.

Specific embodiments of a self repairing integrated circuit package 20 have been described in relation to the figures. Many other embodiments are not described but are nonetheless within the scope of this disclosure. For example, the delamination repair substance 44 may be mixed with the molding compound 32 to repair cracks 34 that develop within the molding compound 32. Likewise, the delamination repair substance 44 may repair or retard cracks 34 that develop in the semiconductor die 24 or any other component of the integrated circuit package 20. The delamination repair substance 44 may utilize any appropriate catalyst and sealing agent. The delamination repair substance 44 may further implement any suitable mechanism for triggering the repair of damage to the integrated circuit package 20, not just microcapsules 51 filled with a sealing agent 46.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device comprising:
   a semiconductor die having a first face and a second face;
   a substrate coupled to the first face of the semiconductor die;
   a delamination repair layer positioned directly on the second face of the semiconductor die;
   a molding compound positioned directly on the delamination repair layer so that the delamination repair layer is positioned between the molding compound and the semiconductor die;
   a plurality of microcapsules positioned within the delamination repair layer between the semiconductor die and the molding compound, the microcapsules containing a sealing compound in liquid form; and
   a catalyst positioned within the delamination repair layer and adjacent to the microcapsules, the catalyst being of type that causes the sealing compound in the microcapsules to polymerize into a solid material that will adhere to the die, upon contact with the catalyst.

2. The device of claim 1 wherein the microcapsules are configured to rupture and spill the sealing compound when the molding compound becomes delaminated from the semiconductor die or the substrate.

3. The device of claim 1 wherein a polymerization of the sealing compound seals the molding compound to the semiconductor die.

4. The device of claim 1 wherein the molding compound is separate and distinct from the delamination repair layer.

5. The device of claim 1 wherein a first portion of a first face of the delamination repair layer directly contacts the second face of the semicounductor die, a second portion of the first face the delamination repair layer directly contacts a face of the substrate, and a second face of the delamination repair layer directly contacts the compound.

6. The device of claim 1, further comprising:
an adhesive film that directly couples a face of the substrate to the first face of the semiconductor die, the adhesive film including a top face, a bottom face and a plurality of side faces, the top face of the adhesive film directly contacting the first face of the semiconductor die, the bottom face of the adhesive film directly contacting the face of the substrate, and the delamination repair layer directly contacting at least one of the side faces of the adhesive film and the face of the substrate.

7. The device of claim 1, further comprising:
a plurality of solder bumps that directly couple a face of the substrate to the first face of the semiconductor die; and
an underfill substance interposed between the solder bumps, the substrate and the semiconductor die, the delamination repair layer directly contacting a portion of the underfill substance and the face of the substrate.

8. A method comprising:
applying a delamination repair layer to a surface of a semiconductor die, the delamination repair layer including a plurality of microcapsules and a catalyst adjacent to the microcapsules, the microcapsules containing a sealing compound in liquid form;
covering the semiconductor die and the delamination repair layer with a molding compound, the delamination repair layer being positioned at an interface of the semiconductor die and the molding compound;
rupturing the microcapsules if the molding compound delaminates from the semiconductor die;
mixing the catalyst with the sealing compound if the microcapsules rupture;
polymerizing the sealing compound into a solid material if the catalyst mixes with the sealing compound; and
sealing the molding compound to the semiconductor die if the sealing compound is polymerized.

9. The method of claim 8 comprising mixing the catalyst and the microcapsules in a liquid prior to applying the delamination repair layer to the surface of the semiconductor die.

10. The method of claim 9 wherein the applying the delamination repair layer to the surface of a semiconductor die includes spraying the liquid onto the surface of the semiconductor die.

11. The method of claim 9 wherein the applying the delamination repair layer to the surface of a semiconductor die includes dipping the semiconductor die into the liquid.

12. The method of claim 8, further comprising:
coupling the semiconductor die to a substrate before applying the delamination repair layer to the surface of the semiconductor die, the applying the delamination repair layer to the surface of a semiconductor die including applying the delamination repair layer to a surface of the substrate.

13. The method of claim 12 wherein the coupling the semiconductor die to the substrate includes attaching a plurality of solder bumps to the first face of the semiconductor die and applying an underfill substance between the solder bumps, the substrate and the semiconductor die, and the applying the delamination repair layer to the surface of a semiconductor die includes applying the delamination repair layer to a surface of the underfill substance and the face of the substrate.

14. The method of claim 12 wherein the coupling the semiconductor die to the substrate includes attaching an adhesive film to the first face of the semiconductor die and the face of the substrate, and the applying the delamination repair layer to the surface of a semiconductor die includes applying the delamination repair layer to a surface of the adhesive film and the face of the substrate.

15. An integrated circuit package comprising:
a semiconductor die having a first surface and a second surface;
a delamination repair layer having a first surface and a second surface, the first surface of the delamination repair layer being in direct contact with the first surface of the semiconductor die, the delamination repair layer having:
a catalyst; and
a plurality of microcapsules positioned adjacent the catalyst, the microcapsules containing a sealing compound in liquid form, the sealing compound being of a type that polymerizes upon contact with the catalyst; and
a molding compound directly contacting the second surface of the delamination repair layer, and covering the delamination repair layer and the semiconductor die.

16. The integrated circuit package of claim 15 wherein the sealing compound is dicyclopentadiene.

17. The integrated circuit package of claim 15 wherein the catalyst is a Grubbs catalyst.

18. The device of claim 15 wherein the molding compound is separate and distinct from the delamination repair layer.

19. The device of claim 15 further comprising a substrate coupled to the second surface of the semiconductor die, a first portion of the first surface of the delamination repair layer directly contacting the first face of the semicounductor die, and a second portion of the first surface the delamination repair layer directly contacting a surface of the substrate.

20. The device of claim 19 further comprising an attachment portion interposed between the second surface of the semiconductor die and the face of the substrate, a third portion of the first surface of the delamination repair layer directly contacting a portion of the attachment portion.

* * * * *